United States Patent [19]

Andreeva et al.

[11] 4,018,958

[45] Apr. 19, 1977

[54] HIGH-FREQUENCY RASTER WITH IRREGULAR STRUCTURE OF RASTER ELEMENTS

[76] Inventors: Viktoria Ivanovna Andreeva, 3 Rybinskaya ulitsa, 21, korpus 2, kv. 249; Alexandra Ljudovikovna Popova, ulitsa Usievicha, 3, kv. 88; Veniamin Semenovich Lapatukhin, Teply Stan, ulitsa Ostrovityanova, mikroraion 1a, korpus 16, kv. 16, all of Moscow, U.S.S.R.

[22] Filed: Dec. 24, 1975

[21] Appl. No.: 644,175

Related U.S. Application Data

[62] Division of Ser. No. 451,599, March 15, 1974, Pat. No. 3,976,523.

[52] U.S. Cl. .................................. 428/141; 65/31; 350/162 R; 350/314; 350/321; 428/410

[51] Int. Cl.$^2$ .................. B32B 3/00; C03C 15/00; C03C 25/06

[58] Field of Search .......... 428/410, 141, 142, 149; 65/31; 156/24, 25, 6; 252/79.3; 350/321, 314, 162 R

[56] References Cited

UNITED STATES PATENTS

| | | | |
|---|---|---|---|
| 2,189,988 | 2/1940 | Lester | 156/25 |
| 2,370,214 | 2/1945 | Walker | 252/99.3 X |
| 2,670,279 | 2/1954 | Szegho | 156/6 |
| 2,999,013 | 9/1961 | Meth | 156/24 X |
| 3,374,130 | 3/1968 | Junge | 156/24 |
| 3,527,628 | 9/1970 | Fullerton | 156/24 UX |
| 3,647,583 | 3/1972 | De Rouw | 156/6 |
| 3,813,568 | 5/1974 | Scott | 156/24 |

*Primary Examiner*—Ellis P. Robinson
*Attorney, Agent, or Firm*—Haseltine, Lake & Waters

[57] ABSTRACT

What is proposed is a high-frequency raster with an irregular structure of raster elements. This raster is a plane-parallel glass plate with transparent roughnesses on its surface characterized by a value Ra equal to 0.20–0.26 mu.

The high-frequency raster with an irregular structure of raster elements is preferably prepared by a method in which a glass plate is ground at two sides to obtain a uniform structure of the surface. The ground plate is subjected to etching to obtain transparent microroughnesses with a value Ra equal to 0.20–0.26 mu.

The raster proposed by the present invention is characterized by a high resolving power in the order of 25 mm$^{-1}$, transmits a normal interval of optical densities of 1.0 to 1.2 and is capable of reproducing an image with a finely grained discrete structure.

1 Claim, No Drawings

HIGH-FREQUENCY RASTER WITH IRREGULAR STRUCTURE OF RASTER ELEMENTS

This is a divisional of applicants' co-pending patent application Ser. No. 451,599, filed Mar. 15, 1974, titled "High-Frequency Raster with Irregular Structure of Raster Elements and Method of Manufacturing the Same", now U.S. Pat. No. 3,976,523 dated Aug. 24, 1976.

The present invention relates to polygraphic industry and, more particularly, the invention relates to high-frequency rasters with an irregular structure of the raster elements and to a method of manufacturing the same.

The rasters are widely used for conversion of a half-tone image into a raster image at the stage of a photographic process when producing printing forms for reproducing an image with an irregular structure of raster elements.

High-frequency rasters with an irregular structure of their elements have a number of advantages over the well known and widely used rasters with a periodic structure of raster elements; in particular, they have a higher resolving power. An image reproduced by means of such a raster is characterized by complete absence of moire. This feature of a raster with an irregular structure allows the resolution of an image to be improved to a considerable extent, thus improving the viasual perception of the image reproduction as a whole.

Known in the art is a high-frequency raster with an irregular structure of raster elements comprising a plane-parallel glass plate having at both its surfaces frosted micro-roughnesses characterized by a value Ra in the order of 0.32–0.33 mu.

This raster has a sufficiently high resolving power; however, the interval of optical densities reproduced by the known raster is low and this makes it difficult to reproduce different originals.

Known in the prior art is a method of manufacturing a high-frequency raster with an irregular structure of raster elements, which is effected by means of bilateral etching of a glass plate by vapours of hydrofluoric acid. The plate is treated in vapours of hydrofluoric acid until there is obtained on its surface a microstructure with a value of microroughnesses characterized by Ra equal to 0.32–0.33 mu. This method of manufacturing a raster has significant disadvantages. The nonuniform swirling evaporation of hydrofluoric acid in the process of etching the glass results in that it is difficult to obtain a surface with a similar mean-statistical value Ra of microroughnesses over the whole area of the plate being processed. This results in nonuniformity of the mean-statistical characteristic of the structure of the raster image and deteriorates its quality.

The microstructure of the glass surface treated with hydrofluoric acid is matted. Such a character of microroughness on the raster surface results in a low (in the order of 0.7) interval of optical densities transmitted by the raster.

An object of the present invention is to provide a high-frequency raster with an irregular structure which is capable of creating a discrete image on a recording photographic layer.

Another object of the invention is to provide a high-frequency raster with an irregular structure which is characterized by a high resolving power.

Still another object of the invention is to provide a high-frequency raster with an irregular structure which transmits a normal interval of optical densities.

These and other objects are attained by providing a high-frequency raster with an irregular structure of raster elements which comprises a glass plate having microroughnesses on both its surfaces; according to the invention, the value of the microroughnesses characterized by Ra is equal to 0.20–0.26 mu.

The proposed raster has a high resolving power in the order of 25 mm$^{-1}$, is capable of producing a discrete image on a recording photographic layer, and can transmit an interval of optical densities of 1.0–1.2.

It is expedient to make a high-frequency raster with an irregular structure of raster elements by a method in which a glass plate is etching both sides with hydrofluoric acid and, according to the present invention, prior to the etching, the plate is ground at two sides to obtain a uniform structure of its surfaces; the etching is effected repeatedly until microroughnesses are obtained which are characterized by a value Ra equal to 0.20–0.26 mu.

Using the proposed method, it is possible to obtain a transparent raster producing a high-frequency raster image on a recording photographic layer, having a resolving power in the order of 26 mm$^{-1}$ and transmitting an interval of optical densities of 1.0–1.2.

According to the present invention, the plate is preferably etched at least three times.

The etching of the glass plate at least three times provides for uniformly distributed microroughnesses of a specified value on an optically cleared surface.

One embodiment of the present invention involves etching of the plate in a solution containing 4 parts by volume of hydrofluoric acid and 1 part by volume of sulphuric acid.

Another embodiment of the invention consists in that the plate is subjected to etching in a solution comprising 3 parts by volume of hydrofluoric acid and 1 part by volume of phosphoric acid.

Still another embodiment of the invention consists in that the plate is subjected to etching in a solution containing 4 parts by volume of hydrofluoric acid, 1 part by volume of sulphuric acid and 1 part by volume of water.

When using the above-mentioned solutions, it is possible to carry out uniform etching of the whole surface of the plate and to obtain a unique characteristic of the microroughnesses.

Given below is a detailed description of the present invention from which one can see further advantages of the proposed high-frequency raster with an irregular structure of raster elements and a method of manufacturing such rasters.

The high-frequency raster with an irregular structure of raster elements is made of a plane-parallel glass plate, both surfaces of which have microroughnesses whose Ra is equal to 0.20–0.26 mu.

It is well known that such microroughnesses are characterized by a value Ra which gives an impression of a mean square value of deviation of the microroughnesses from the average line of their profile.

The raster proposed in the present invention has these microroughnesses with the same mean-statistical value Ra over the whole surface of the glass plate, which results in uniformity of the mean-statistical characteristic of the raster image.

The high resolving power of the raster is equal to 25 mm$^{-1}$, the normal interval of optical densities transmitted by the raster and the capability of creating a discrete structure of an image on a recording photographic layer are attained due to the fact that the raster has on its surface transparent microroughnesses whose value is equal to 0.20–0.26 mu.

According to the present invention, the high-frequency raster with an irregular structure of raster elements is prepared as follows.

A plane-parallel glass plate having a thickness of 1 to 10 mm is ground at both sides to obtain a surface with the same mean-statistical value Ra of microroughnesses and to produce microroughnesses with parameters that determine the frequency and size of the future raster elements on a raster image. However, such a treatment of the surface of the glass plate results in a matted microstructure so that the application of a raster with such a microstructure reslts in dispersion of light and reduction of the interval of optical densities of a half-tone image.

According to the invention, the microroughnesses with an optically cleared, transparent surface are produced by subjecting the ground plate to chemical etching. It is expedient to use an etching solution containing 4 parts by volume of hydrofluoric acid, 1 part by volume of sulphuric acid, or a an etching solution containing 3 parts by volume of hydrofluoric acid and 1 part by volume of phosphoric acid, or an etching solution containing 4 parts by volume of hydrofluoric acid, 1 part by volume of sulphuric acid and 1 part by volume of water. The above etching solutions provide for a uniform and gradual etching of the surface being treated.

A finely grained structure with a high uniformity over the whole surface of the raster being made is obtained by means of multiple etching. The plate is preferably be etched at least three times.

Single etching of the plate results in formation of a coarse structures of the surface and, therefore, reduces the resolving power of the raster and deteriorates visual perception of the raster image.

The etching is followed by washing in water. This treatment is carried out until transparent microroughnesses are obtaines whose value Ra is equal to 0.20–0.26 mu; these roughnesses are capable of producing a discrete image on a recording layer.

Such a combined treatment makes it possible to obtain transparent high-frequency rasters with an irregular structure of raster elements having a high resolving power in the order of 25 mm$^{-1}$, transmitting a normal interval of optical densities of 1.0–1.2, and reproducing images with a finely grained discrete structure with irregular raster elements (variable in area, quantity and shape).

The proposed rasters can be employed in contact-type copying devices. The high-frequency transparent rasters can also be used for reproduction of artistic originals with a great amount of fine details of an image, since they make it possible to considerably increase the accuracy of the transmission due to a high resolving power and the absence of moire.

EXAMPLE 1

A plane-parallel glass plate is ground at both sides by an abrasive powder, each side being ground during 40 minutes; then the ground plate is carefully washed and subjected to chemical treatment in a solution of the following composition 4 parts by volume of hydrofluoric acid, 1 part by volume of sulphuric acid.

The etching is carried out in 5 stages; in the intervals between these stages the plate is washed with water. After this treatment, transparent microroughnesses are obtained on the surface of the glass plate, whose value Ra is equal to 0.22 mu.

Due to the above-said combined treatment there is obtained a transparent raster with an irregular structure of raster elements reproducing an interval of optical densities of an image of 1.1–1.2 and with a resolving power of 25 mm$^{-1}$.

EXAMPLE 2

A plane-parallel plate is ground at two sides, each side being ground during 40 minutes. After careful washing of the plate it is subjected to chemical etching in a solution having the following composition: 3 parts by volume of hydrofluoric acid and 1 part by volume of phosphoric acid. The treatment is carried out in 4 stages; the etching stages are alternated with washing of the plate in water. On the surface of the glass plate there are produced transparent microroughnesses whose value Ra is equal to 0.24 mu.

Thus, the obtained high-frequency raster with an irregular structure of raster elements transmits an interval of optical densities of 1.0–1.1 and has a resolving power of 25 mm$^{-1}$.

EXAMPLE 3

A plane-parallel glass plate is ground at two sides with an abrasive compound, each side being ground during 40–45 minutes. After washing the ground plate with water, it is treated with a solution of the following composition: 4 parts by volume of hydrofluoric acid, 1 part by volume of sulphuric acid and 1 part by volume of water. The etching is effected 5 times with intermediate washing of the plate with water. As a result, there is obtained a high-frequency raster with an irregular structure of raster elements with transparent microroughnesses on the raster surface having a value Ra equal to 0.24 mu.

The obtained raster transmits an interval of optical densities of 1.1 and has a resolving power of 25 mm$^{-1}$.

What is claimed is:

1. An optical high-frequency raster with an irregular structure of raster elements, the raster comprising a substantially plane-parallel glass plate mechanically ground on both sides to obtain a uniform surface structure and having transparent microroughnesses on both surfaces, the microroughnesses having a value Ra equal to 0.2 to 0.26 m$\mu$, washed with water and subjected to multiple etching, at least three times, to obtain the transparent microroughnesses, whereby the resulting raster has a high resolving power of at least 25 mm$^{-1}$, and is capable of transmitting an interval of optical densities between approximately 1.0 and 1.2.

* * * * *